US010368431B2

United States Patent
Chen et al.

(10) Patent No.: US 10,368,431 B2
(45) Date of Patent: Jul. 30, 2019

(54) COOLING ASSEMBLIES FOR ELECTRONIC DEVICES

(71) Applicant: Astec International Limited, Kowloon (HK)

(72) Inventors: Yu-wei Chen, Taipei (TW); Yi-kai Lan, Taipei (TW); Shih-chien Chou, Taipei (TW)

(73) Assignee: Astec International Limited, Kwun Tong, Kowloon (HK)

( * ) Notice: Subject to any disclaimer, the term of this patent is extended or adjusted under 35 U.S.C. 154(b) by 0 days.

(21) Appl. No.: 15/655,515

(22) Filed: Jul. 20, 2017

(65) Prior Publication Data

US 2019/0029104 A1    Jan. 24, 2019

(51) Int. Cl.
*H05K 1/02* (2006.01)
*H05K 7/20* (2006.01)

(52) U.S. Cl.
CPC ........... *H05K 1/0206* (2013.01); *H05K 7/209* (2013.01); *H05K 2201/066* (2013.01); *H05K 2201/10166* (2013.01)

(58) Field of Classification Search
CPC ..... H05K 1/0206; H05K 7/209; H02M 7/003; H02M 7/007
USPC .................................................. 361/709, 719
See application file for complete search history.

(56) References Cited

U.S. PATENT DOCUMENTS

| 6,200,407 B1* | 3/2001 | Wieloch ................. H05K 1/021 156/252 |
| 7,955,411 B2* | 6/2011 | Yasuda ................. B22F 1/0014 75/228 |
| 8,056,614 B2 | 11/2011 | Chen et al. |
| 8,737,075 B2* | 5/2014 | Yamashita ........... B23K 1/0016 174/252 |
| 9,379,039 B2 | 6/2016 | Lam et al. |
| 2007/0205038 A1* | 9/2007 | Tominaga ............ B62D 5/0406 180/444 |
| 2010/0177536 A1* | 7/2010 | Liu .................... H02M 3/33592 363/17 |
| 2016/0094175 A1* | 3/2016 | Yamasaki ............... H02P 29/68 318/724 |

* cited by examiner

*Primary Examiner* — Mukundbhai G Patel
(74) *Attorney, Agent, or Firm* — Harness, Dickey & Pierce, P.L.C.

(57) ABSTRACT

According to some aspects of the present disclosure, cooling assemblies for electronic devices are disclosed. Example cooling assemblies include a circuit board having a first surface and a second surface opposite the first surface, a first set of electronic devices, a second set of electronic devices, and a third set of electronic devices. Each set includes at least two electronic devices electrically coupled in parallel and disposed on the first surface of the circuit board. At least one of the electronic devices of the first set is adjacent one of the electronic devices of the second set and is adjacent one of the electronic devices of the third set. The cooling assembly further includes a heat sink disposed on the second surface of the circuit board. The heat sink is in thermal contact with the first set, the second set, and the third set of electronic devices.

20 Claims, 8 Drawing Sheets

COOLING ASSEMBLIES FOR ELECTRONIC DEVICES

FIELD

The present disclosure relates to cooling assemblies for electronic devices.

BACKGROUND

This section provides background information related to the present disclosure which is not necessarily prior art.

Electronic devices are commonly used on circuit boards in electric power supplies. Heat sinks are typically used to dissipate unwanted heat generated by the electronic devices.

SUMMARY

This section provides a general summary of the disclosure, and is not a comprehensive disclosure of its full scope or all of its features.

According to one aspect of the present disclosure, a cooling assembly for electronic devices includes a circuit board having a first surface and a second surface opposite the first surface, a first set of electronic devices, a second set of electronic devices, and a third set of electronic devices. Each set includes at least two electronic devices electrically coupled in parallel and disposed on the first surface of the circuit board. At least one of the electronic devices of the first set is adjacent one of the electronic devices of the second set and is adjacent one of the electronic devices of the third set. The cooling assembly further includes a heat sink disposed on the second surface of the circuit board. The heat sink is in thermal contact with the first set of electronic devices, the second set of electronic devices, and the third set of electronic devices.

According to another aspect of the present disclosure, a cooling assembly for electronic devices includes a circuit board having a first surface and a second surface opposite the first surface, a first set of electronic devices, a second set of electronic devices, and a third set of electronic devices. Each set includes at least two electronic devices electrically coupled in parallel and disposed on the first surface of the circuit board. The cooling assembly further includes a heat sink disposed on the second surface of the circuit board. The heat sink includes a first heat sink portion in thermal contact with the first set of electronic devices, a second heat sink portion in thermal contact with the second set of electronic devices, a third heat sink portion in thermal contact with the third set of electronic devices, a fin structure in thermal contact with the three heat sink portions, and an electrical insulation layer disposed between the fin structure and the three heat sink portions to electrically isolate the three heat sink portions from one another.

Further aspects and areas of applicability will become apparent from the description provided herein. It should be understood that various aspects and features of this disclosure may be implemented individually or in combination with one or more other aspects or features. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding features throughout the several views of the drawings.

DETAILED DESCRIPTION

Figure 1:
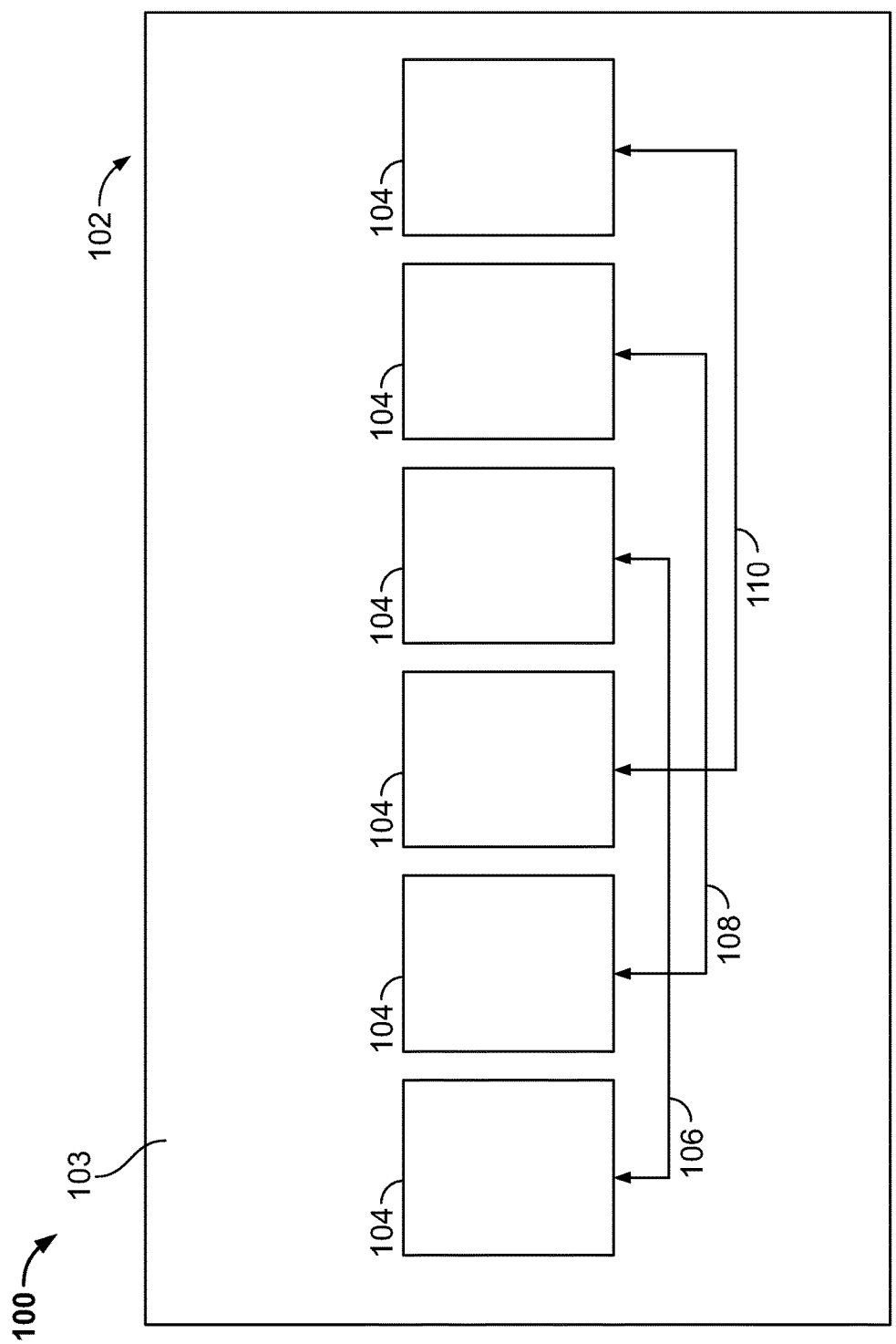
FIG. 1 is a front view of a cooling assembly for electronic devices according to one example embodiment of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

A cooling assembly for electronic devices according to one example embodiment of the present disclosure is illustrated in FIG. 1 and indicated generally by reference number 100. As shown in FIG. 1, the cooling assembly 100 includes a circuit board 102 (e.g., printed circuit board, etc.) having a first surface 103 and a second surface (not shown in FIG. 1) opposite the first surface 103.

The cooling assembly 100 includes a first set 106 of electronic devices 104, a second set 108 of electronic devices 104, and a third set 110 of electronic devices 104. As shown in FIG. 1, each set includes two electronic devices 104, although other embodiments could include more than two electronic devices 104 per set (e.g., three per set, etc.). Within each set, the electronic devices 104 are coupled in parallel with one another (e.g., via a circuit board trace, wire, etc.; not shown).

Some of the electronic devices 104 are arranged so that electronic devices 104 from other sets are adjacent each side of the electronic device 104. For example, each electronic device 104 of set 108 is adjacent an electronic device 104 of set 106 on a left side, and adjacent an electronic device 104 of set 110 on a right side (referring to FIG. 1).

The cooling assembly 100 also includes a heat sink (not shown) disposed on the second surface of the circuit board 102. The heat sink is in thermal contact with the first set 106 of electronic devices 104, the second set 108 of electronic devices 104, and the third set 110 of electronic devices 104 to facilitate dissipation of heat from the electronic devices 104.

As shown in FIG. 1, the electronic devices 104 are disposed on the surface 103 of the circuit board 102 in a substantially linear arrangement. The two electronic devices 104 at opposite ends of the linear arrangement are adjacent only a single other electronic device 104.

The four electronic devices 104 in the middle portion of the linear arrangement are each disposed adjacent other electronic devices 104 belonging to different sets. For example, each of the four electronic devices 104 in the middle portion have electronic devices 104 belonging to different sets disposed adjacent opposite sides of the electronic device 104.

Therefore, none of the electronic devices 104 in FIG. 1 are adjacent another electronic device 104 belonging to the same set (although in some embodiments at least two electronic devices belonging to the same set may be adjacent one another, etc.).

The arrangement of the electronic devices 104 in FIG. 1 may be considered as an interleaved arrangement, etc. This arrangement can reduce concentrations of current flows, because electronic devices 104 belonging to the same set which are coupled in parallel are located at spaced positions on the circuit board 102. Therefore, the electromagnetic fields generated by current flow through electronic devices 104 belonging to the same set can be reduced.

As mentioned above, the specific arrangement of electronic devices 104 illustrated in FIG. 1 is only one example embodiment of the cooling assembly 100. In other embodiments, the cooling assembly 100 may include more or less than three sets of electronic devices 104, may include more than two electronic devices 104 per set (e.g., three per set, etc.), etc. The electronic devices 104 may be arranged in other than a linear arrangement, the electronic devices 104 may be arranged so that one or more of the electronic devices 104 are adjacent other electronic device(s) 104 belonging to a same group, etc.

Figure 2:
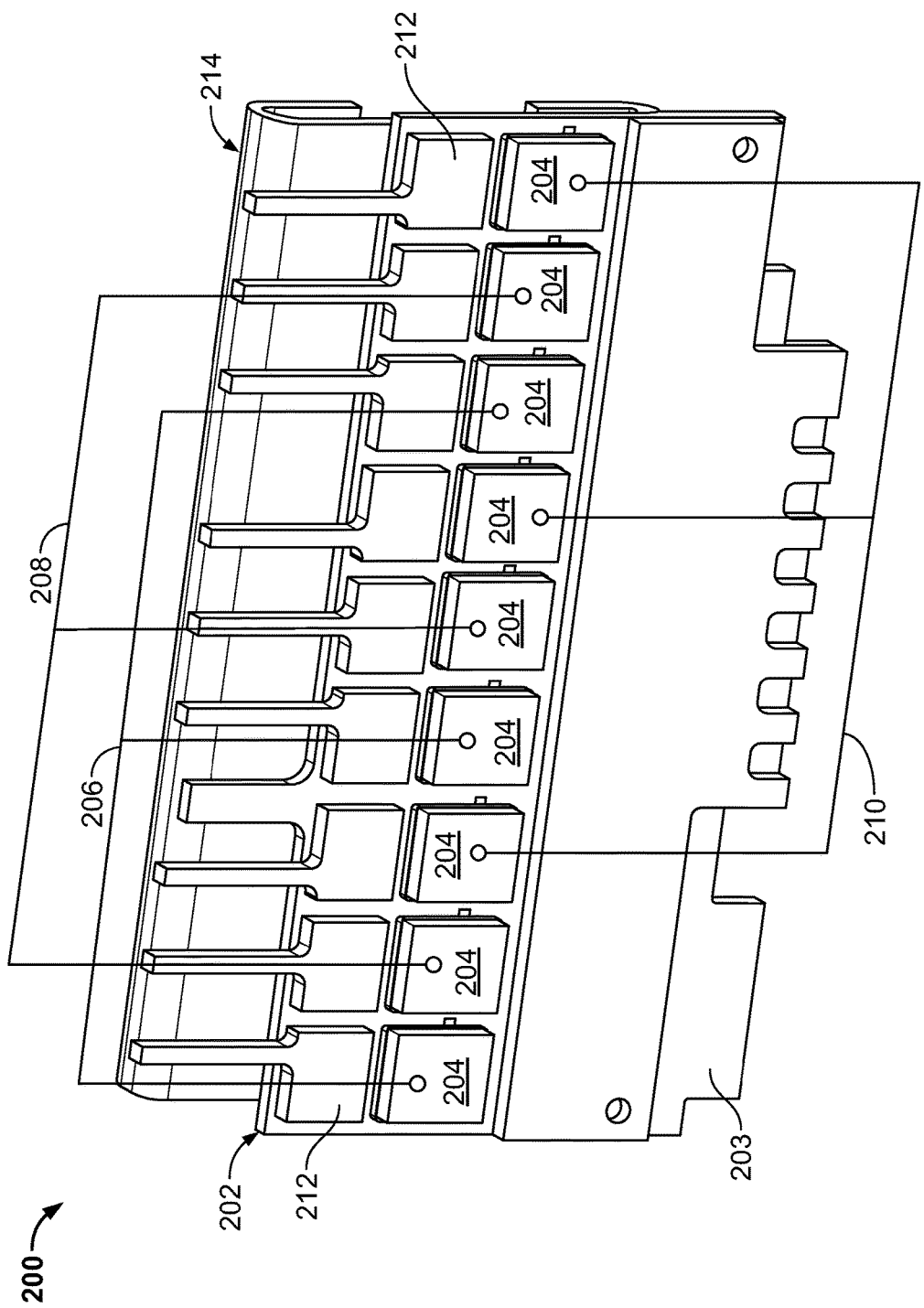
FIG. 2 is a perspective view of a cooling assembly for electronic devices, according to another example embodiment of the present disclosure.

FIG. 2 illustrates a cooling assembly 200 for electronic devices, according to another example embodiment of the present disclosure. The cooling assembly 200 includes a circuit board 202 having a first surface 203, and a second surface (not shown) opposite the first surface 203.

The cooling assembly 200 includes a first set 206 of electronic devices 204, a second set 208 of electronic devices 204, and a third set 210 of electronic devices 204. As shown in FIG. 2, each set includes three electronic devices 204. Within each set, the electronic devices 204 are coupled in parallel with one another, via circuit traces 212.

As one example, in each set the electronic devices 204 may include multiple field-effect transistors (FETs) that are used for current sharing. In this case, a desired number of FETs may be selected based on a current flowing through the FETs (e.g., an output current of a power supply including the FETs, etc.). Higher output currents may increase the number of FETs per set, while lower output currents may decrease the number of FETs per set.

Figure 3:
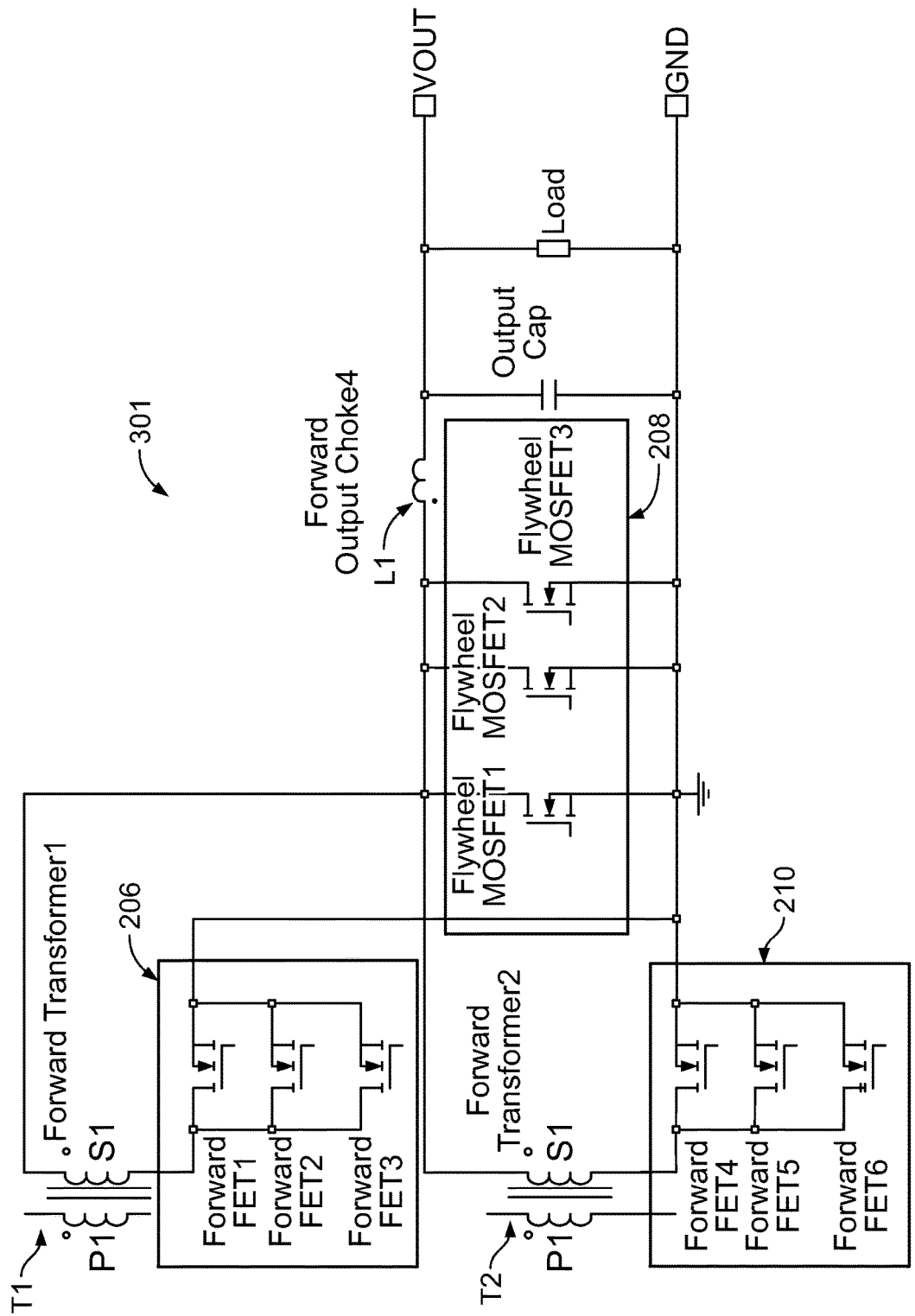
FIG. 3 is a circuit diagram of an example circuit arrangement for connecting the electronic devices of FIG. 2.

One example circuit arrangement for coupling the electronic devices 204 (e.g., FETs) in each set 206, 208 and 210 is illustrated in FIG. 3, and referenced generally by 301. The circuit arrangement 301 is disposed on a secondary side of a power converter (not shown).

As shown in FIG. 3, the first set 206 includes three forward FETs (FET1, FET2 and FET3) coupled in parallel. The first set 206 is coupled to a secondary winding S1 of a first forward transformer T1. Therefore, the three forward FETs of the first set 206 can transfer energy received at the secondary winding S1 of the first forward transformer T1 (e.g., by current sharing among the FETs) when the power converter is operating in a forward mode.

Similarly, the third set 210 includes three forward FETs (FET4, FET5 and FETE) coupled in parallel. The third set 210 is coupled to a secondary winding S1 a second forward transformer T2. Therefore, the three forward FETs of the third set 210 can transfer energy received at the secondary winding S1 of the second forward transformer T2 when the power converter is operating in the forward mode.

The second set 208 includes three flywheel metal-oxide-semiconductor FETs (MOSFET1, MOSFET2 and MOSFET3) coupled in parallel. The second set 208 is coupled to a forward output choke L1. Therefore, the three flywheel MOSFETs of the second set 208 can provide a discharge loop for an output choke current when the forward FETs of the first set 206 and/or the forward FETs of the third set 210 are OFF. In this case, the flywheel MOSFETs of the second set 208 are ON. During the forward mode, the flywheel MOSFETs of the second set 208 are OFF and the forward FETs of the first set 206 and/or the forward FETs of the third set 210 are ON.

The circuit arrangement 301 illustrated in FIG. 3 is only one example embodiment, and the electronic devices 204 of the first set 206, the second set 208 and the third set 210 may be coupled in other circuit arrangements in other embodiments.

Referring back to FIG. 2, some of the electronic devices 204 are arranged so that electronic devices 204 from other sets are adjacent each side of the electronic device 204. For example, each electronic device 204 of set 208 is adjacent an electronic device 204 of set 206 on a left side, and adjacent an electronic device 204 of set 210 on a right side.

The cooling assembly 200 also includes a heat sink 214 disposed on the second surface of the circuit board 202. The heat sink 214 is in thermal contact with the first set 206 of electronic devices 204, the second set 208 of electronic devices 204, and the third set 210 of electronic devices 204 to facilitate dissipation of heat from the electronic devices 204.

Figure 4:
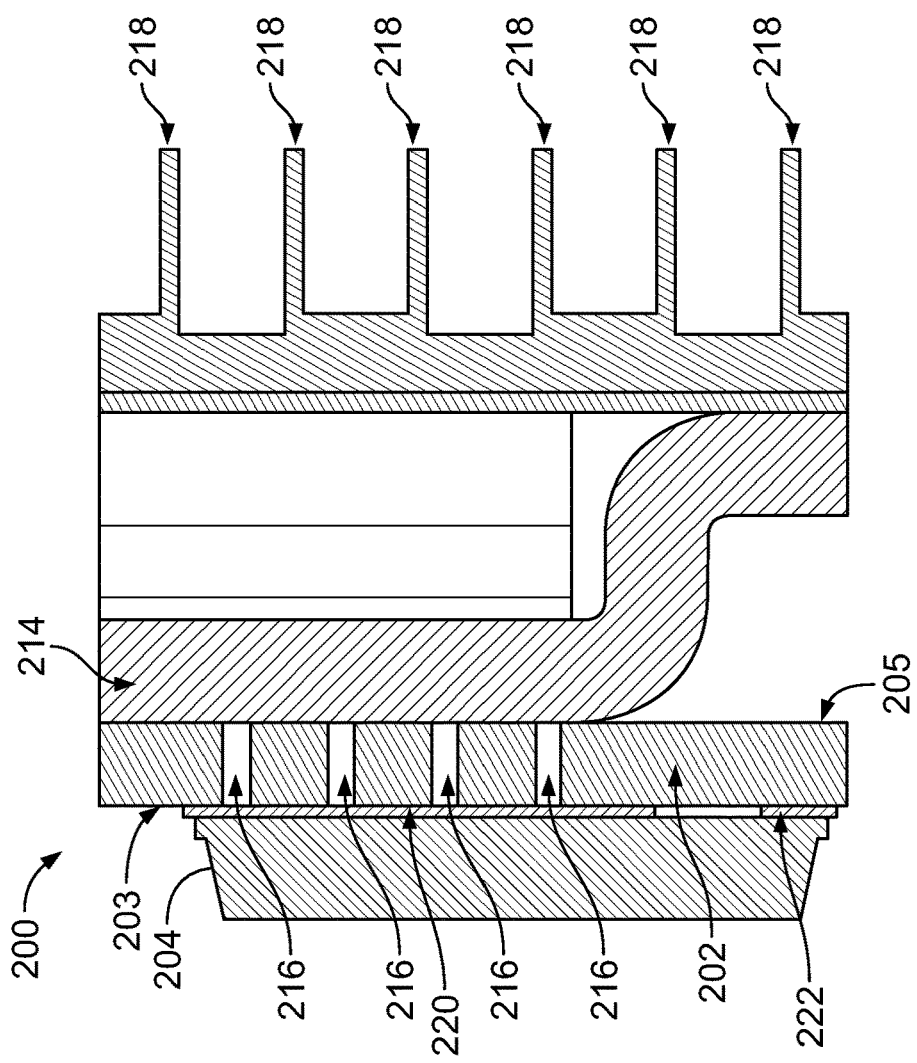
FIG. 4 is a sectional view of the cooling assembly of FIG. 2.

FIG. 4 is a sectional view of the cooling assembly 200, illustrating a thermal heat path from one of the electronic devices 204 to the heat sink 214. As shown in FIG. 4, the printed circuit board 202 includes multiple vias 216 (e.g., plated via holes, etc.) between the first surface 203 and the second surface 205 of the circuit board 202.

The vias 216 facilitate thermal contact (e.g., heat transfer, dissipation, etc.) between the electronic device 204 on the first surface 203 of the circuit board 202, and the heat sink 214 on the second surface 205 of the circuit board. For example, the electronic device 204 may include a surface mount device, such that the vias 216 are in thermal contact with a surface of the electronic device 204.

Although FIG. 4 illustrates four vias 216, other embodiments may include more or less vias 216, vias 216 spaced in different arrangements between the first surface 203 and the second surface 205 of the circuit board 202, vias 216 spaced in different arrangements relative to the electronic device 204 and the heat sink 214, etc.

As shown in FIG. 4, the heat sink 214 includes a fin structure 218. The fin structure 218 includes multiple fins adapted to facilitate heat dissipation from the heat sink 214 and the electronic devices 204. Further details of the heat sink 214 and fin structure 218 will be described below.

As described above, the electronic devices herein may include any suitable electronic components (e.g., power devices, etc.) that generate undesired heat during operation. For example, in some embodiments the electronic components may include switching devices. Specifically, the electronic components may include metal-oxide-semiconductor field-effect transistors (MOSFETs).

Figure 5:
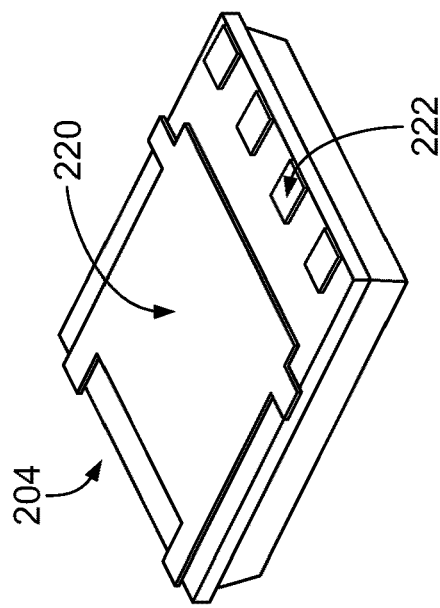
FIG. 5 is a perspective view of an electronic component of the cooling assembly of FIG. 2.

FIG. 5 illustrates an example MOSFET electronic device 204. The MOSFET includes a drain 220 and four source terminals 222 (although other embodiments may include more or less drain and source terminals, etc.). As shown in FIG. 5, the drain 220 and source terminals 222 are surface mount terminals of the MOSFET.

Referring back to FIG. 4, in cooling assembly 200 the drain 220 of electronic device 204 (e.g., a MOSFET, etc.) is in thermal contact with the vias 216, to facilitate heat transfer from the drain 220 of the electronic device 204 to the heat sink 214.

Figure 6:
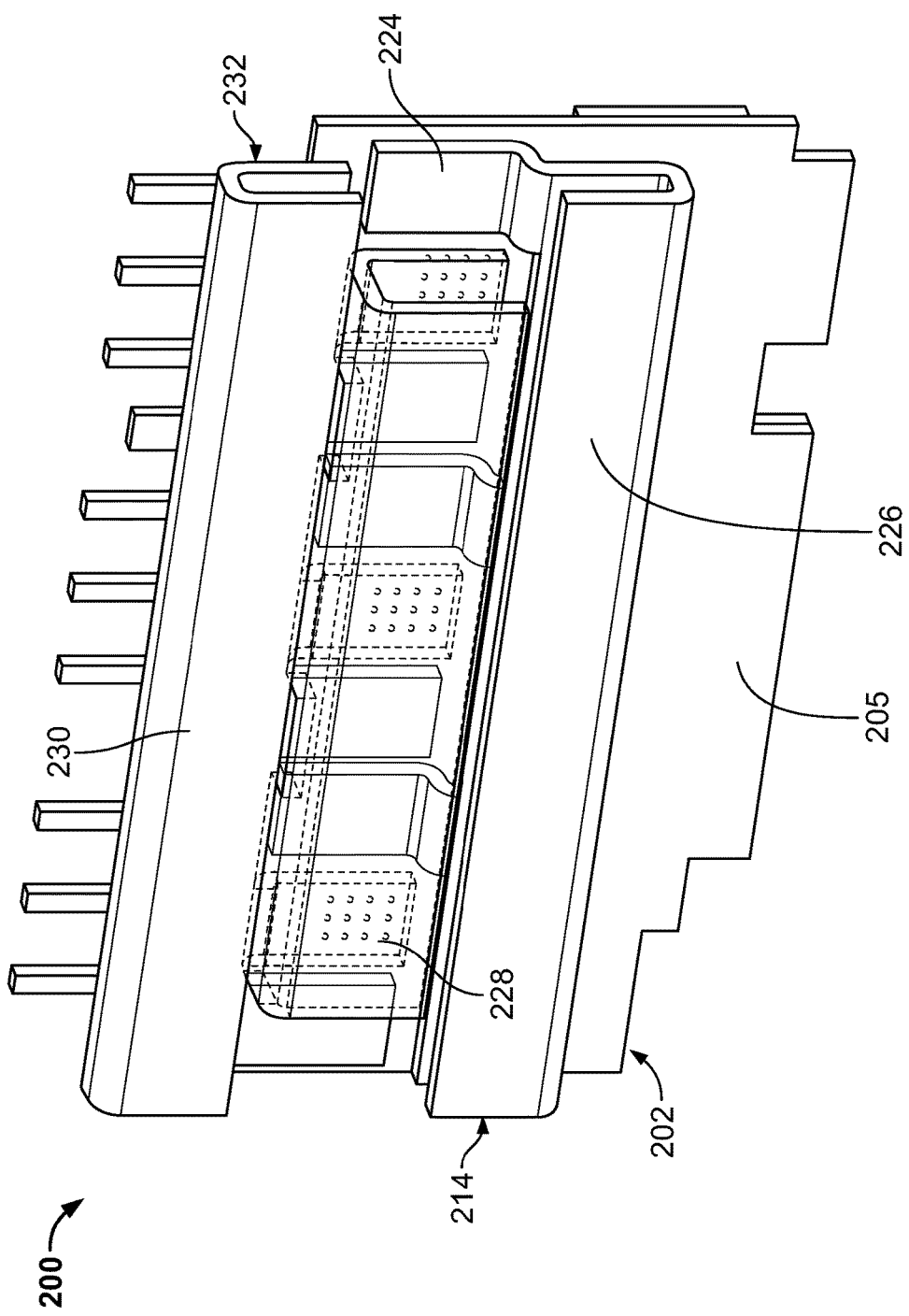
FIG. 6 is a perspective view of an opposite side of the cooling assembly of FIG. 2.

FIG. 6 illustrates the heat sink 214 disposed on the second surface 205 of the circuit board 202. As shown in FIG. 6, the heat sink 214 includes a first heat sink portion 226, a second heat sink portion 228, and a third heat sink portion 230.

Each heat sink portion is in thermal contact with a corresponding one of the sets of electronic devices 204. The first heat sink portion 226 is in thermal contact with the electronic devices 204 of the first set 206, the second heat sink portion 228 is in thermal contact with the electronic devices 204 of the second set 208, and the third heat sink portion 230 is in thermal contact with the electronic devices 204 of the third set 210.

The three heat sink portions in FIG. 6 are electrically isolated from one another (e.g., there is no physical contact between the three heat sink portions, etc.). Therefore, the three heat sink portions may keep the three sets of electronic devices 204 electrically isolated from one another in the cooling assembly 200.

For example, if the electronic devices 204 of each set are electrically isolated from electronic devices 204 of other sets on the first surface 203 of the circuit board, the three heat sink portions may maintain electrical isolation between the different sets of electronic devices 204 (i.e., the heat sink portions will not short an electrical connection between electronic devices 204 belonging to different sets, etc.). In some embodiments, one or more of the electronic devices 204 may be non-insulated devices. Therefore, the three separate portions of the heat sink 214 can inhibit electrical coupling through the heat sink 214 of electronic devices 204 belonging to different sets.

As shown in FIG. 6, each heat sink portion includes three board contact surfaces 224. Each board contact surface 224 corresponds to one of the electronic devices 204 on the first surface 203 of the circuit board 202, to provide thermal contact with the electronic device 204 when the board contact surface 224 is disposed on the second surface 205 of the circuit board 202 opposite the electronic device 204.

The three heat sink portions each include a substantially horizontal cross bar 232 from which the board contact surfaces 224 extend. The three horizontal cross bars 232 are arranged in substantially separate parallel planes to inhibit the cross bars 232 from contacting one another. Similarly, the board contact surfaces 224 extend in directions that avoid contacting one another, to maintain electrical isolation between the three heat sink portions. The board contact surfaces 224 are arranged in a substantially similar pattern (e.g., interleaved, etc.) as the sets of electronic devices 204 to which they correspond.

Figure 7:
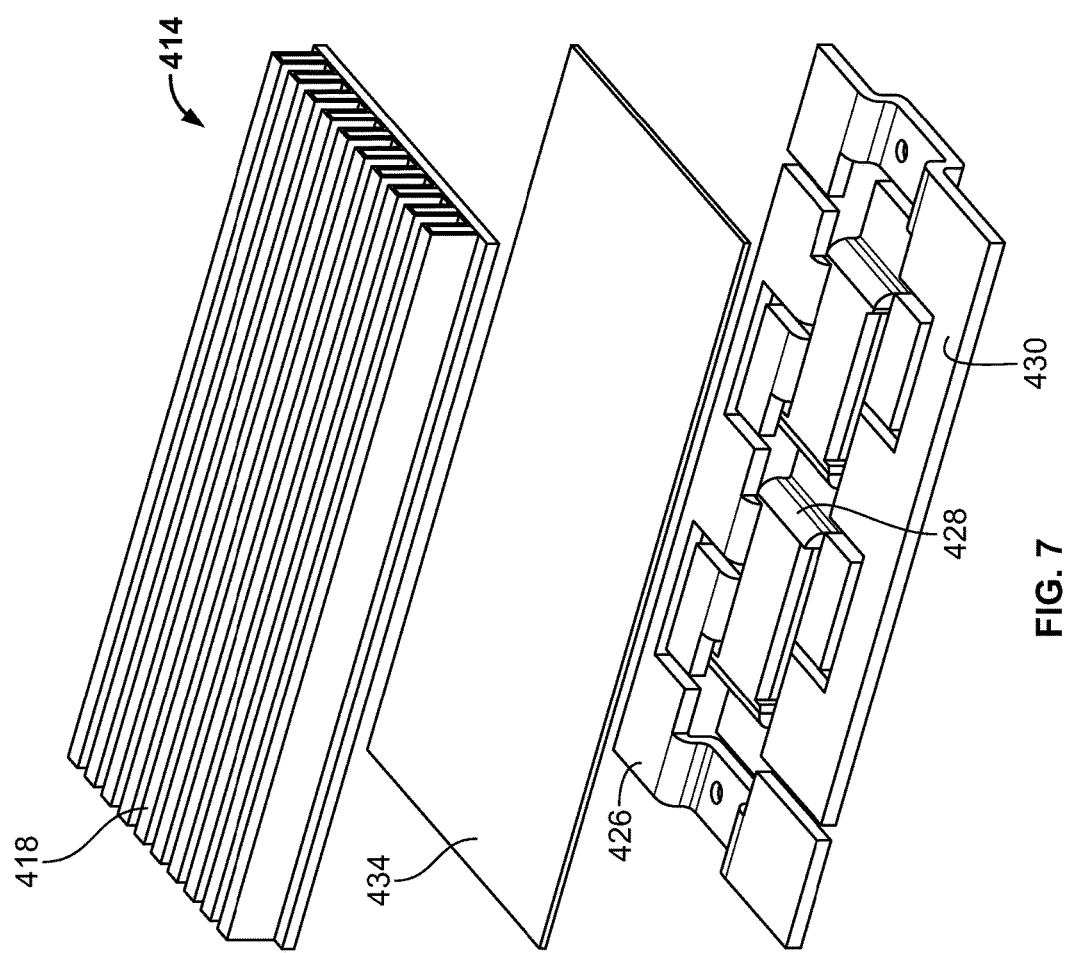
FIG. 7 is an exploded view of a heat sink according to another example embodiment of the present disclosure.

FIG. 7 illustrates a heat sink 414 according to another example embodiment of the present disclosure. As shown in FIG. 7, the heat sink 414 includes a fin structure 418, an electrical insulation layer 434, a first heat sink portion 426, a second heat sink portion 428, and a third heat sink portion 430.

The electrical insulation layer 434 is disposed between the fin structure 418 and the three heat sink portions 426, 428 and 430. The electrical insulation layer 434 provides thermal contact between the fin structure 418 and the three heat sink portions 426, 428 and 430, so the fin structure 418 can dissipate heat from the three heat sink portions 426, 428 and 430 (and electronic components/circuit board(s) coupled to the three heat sink portions, etc.).

The electrical insulation layer 434 may comprise any suitable material capable of transferring heat from the three heat sink portions to the fin structure 418, while maintaining electrical isolation between the fin structure 418 and the three heat sink portions. For example, the electrical insulation layer 434 may have a high thermal conductivity value, a high dielectric characteristic, etc.

Therefore, the electrical insulation layer 434 allows the heat sink portions to remain electrically isolated from one another while dissipating heat through the fin structure 418.

The electrical insulation layer 434 may include adhesive to bond the fin structure 418 to the three heat sink portions 426, 428 and 430.

Figures 8A, 8B:
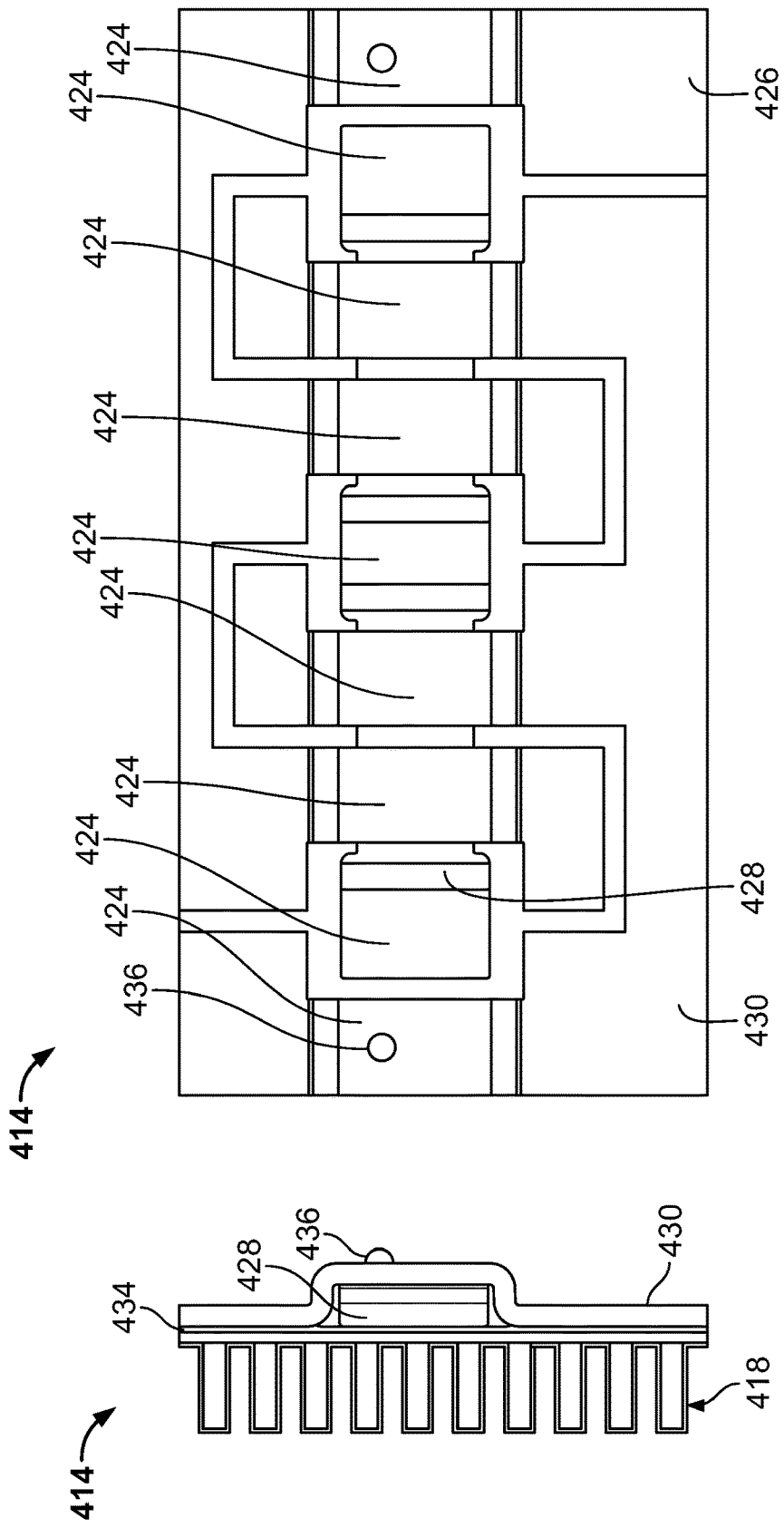
FIG. 8A is a side view of the heat sink of FIG. 7.
FIG. 8B is a front view of the heat sink of FIG. 7.

FIGS. 8A and 8B illustrate side and front views, respectively, of the heat sink 414 illustrated in FIG. 7. As shown in FIG. 8A, the fin structure 418 includes multiple fins for dissipating heat from the heat sink 414. The electrical insulation layer 434 is coupled between the fin structure and the heat sink portions 428 and 430 (heat sink portion 426 not visible).

As illustrated in FIG. 8B, the heat sink portions 426, 428 and 430 each include board contact surfaces 424 which are spaced from one another (e.g., in an interleaved arrangement, etc.). This allows the heat sink portions 426, 428 and 430 to remain electrically isolated from one another, thereby maintaining electrical isolation between sets of electronic devices to which the heat sink portions are coupled.

The heat sink 414 also includes two protrusions 436 (e.g., extrusions, etc.), located at opposite ends of the heat sink 414. The protrusions 436 are adapted to be received in guides on a surface of a circuit board opposite electronic devices, to position the board contact surfaces 424 in thermal contact with corresponding devices. For example, the protrusions 436 may define semi-spheres, while the circuit board surface includes corresponding semi-sphere cavities to receive the protrusions 436.

Figure 9:
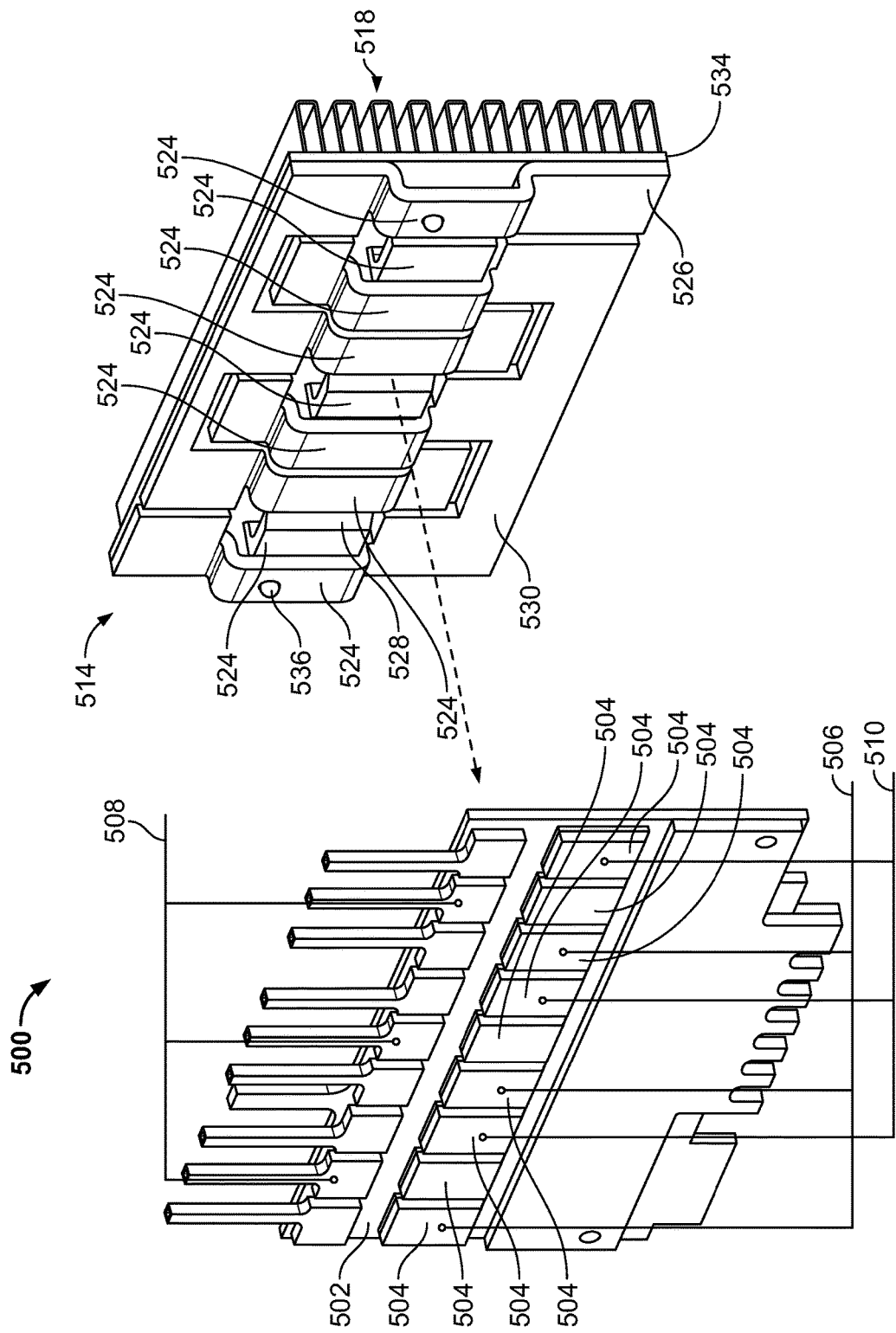
FIG. 9 is an exploded view of a cooling assembly for electronic devices, according to another example embodiment of the present disclosure.

FIG. 9 illustrates a cooling assembly 500 for electronic devices 504 according to another example embodiment of the present disclosure. As shown in FIG. 9, a first set 506 of electronic devices 504, a second set 508 of electronic devices 504, and a third set 510 of electronic devices 504 are disposed on a circuit board 502.

A heat sink 514 is adapted to couple to a surface of the board 502 opposite the electronic devices 504. For example, the heat sink 514 may be soldered, etc. to the circuit board 502. The heat sink 514 includes three heat sink portions 526, 528 and 530, each corresponding to a different one of the sets 506, 508 and 510. The heat sink 514 includes an electrical insulation layer 534 coupled between a fin structure 518 and the three heat sink portions 526, 528 and 530.

The heat sink 514 also includes protrusions 536, which are received in guides (e.g., cavities, etc.; not shown) of the circuit board 502. The protrusions 536 align board contact surfaces 524 of the heat sink portions 526, 528 and 530 with the corresponding electronic devices 504 of the sets 506, 508 and 510.

Any of the example embodiments and aspects disclosed herein may be used in any suitable combination with any other example embodiments and aspects disclosed herein without departing from the scope of the present disclosure. For example, electronic device arrangements described herein may be used with other heat sinks, the heat sinks may be used with other electronic device arrangements, etc. without departing from the scope of the present disclosure.

Example embodiments and aspects of the present disclosure may provide any one or more (or none) of the following advantages: simplified solder reflow process (e.g., no fixture is needed to secure several heat sink portions on the circuit board, etc.), increased efficiency of assembly if only one heat sink is required, enhanced cooling performance via an increased size of heat transfer surfaces, etc.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A cooling assembly for cooling electronic devices, the cooling assembly comprising:
   a circuit board having a first surface and a second surface opposite the first surface;
   a first set of electronic devices, a second set of electronic devices, and a third set of electronic devices, each set including at least two electronic devices electrically coupled in parallel and disposed on the first surface of the circuit board, at least one of the electronic devices of the third set and at least one of the electronic devices of the second set positioned between the at least two electronic devices of the first set; and
   a heat sink disposed on the second surface of the circuit board, the heat sink including a first heat sink portion in thermal contact with the first set of electronic devices, a second heat sink portion in thermal contact with the second set of electronic devices, and a third heat sink portion in thermal contact with the third set of electronic devices, the first, second and third heat sink portions positioned in an interleaved arrangement to overlap one another while remaining electrically isolated from one another.

2. The cooling assembly of claim 1, wherein the electronic devices are disposed on the circuit board in a substantially linear arrangement.

3. The cooling assembly of claim 1, wherein said one of the electronic devices of the second set and said one of the electronic devices of the third set are disposed on the circuit board adjacent opposite sides of said at least one of the electronic devices of the first set.

4. The cooling assembly of claim 1, wherein each set of electronic devices includes a third electronic device.

5. The cooling assembly of claim 1, wherein the circuit board includes, for each of the electronic devices, one or more vias between the first surface and the second surface to facilitate the thermal contact between said electronic device and the heat sink.

6. The cooling assembly of claim 1, wherein at least one of the electronic devices includes a switching device.

7. The cooling assembly of claim 6, wherein the switching device includes a metal-oxide-semiconductor field-effect transistor (MOSFET), and a drain of the MOSFET is in thermal contact with the heat sink.

8. The cooling assembly of claim 1, wherein the electronic devices of the first set are electrically isolated on the circuit board from the electronic devices of the second set and the third set.

9. The cooling assembly of claim 1, wherein the heat sink includes a fin structure in thermal contact with the first heat sink portion, the second heat sink portion, and the third heat sink portion, to facilitate dissipation of heat from the first portion, the second portion and the third portion.

10. The cooling assembly of claim 1, wherein the heat sink includes an electrical insulation layer disposed between the fin structure and the first heat sink portion, the second heat sink portion and the third heat sink portion.

11. The cooling assembly of claim 1, wherein each heat sink portion includes multiple board contact surfaces, each of the multiple board contact surfaces in thermal contact with the second surface of the circuit board opposite a corresponding one of the electronic devices.

12. The cooling assembly of claim 11, wherein at least one of the multiple board contact surfaces of the first heat sink portion is adjacent one of the multiple board contact surfaces of the second heat sink portion and one of the multiple board contact surfaces of the third heat sink portion.

13. The cooling assembly of claim 1, wherein the heat sink includes at least two protrusions, each protrusion received in a corresponding one of multiple guides on the second surface of the circuit board to facilitate alignment of the heat sink with the corresponding electronic devices on the first surface of the circuit board.

14. The cooling assembly of claim 1, wherein at least one of the electronic devices includes a non-insulated electronic device.

15. A power supply including:
the cooling assembly of claim 1;
a first transformer having a primary winding and a secondary winding;
a second transformer having a primary winding and a secondary winding; and
an output choke inductor, wherein:
the at least two electronic devices of the first set each comprise a forward field-effect transistor (FET) coupled between the secondary winding of the first transformer and the at least two electronic devices of the third set;
the at least two electronic devices of the second set each comprise a forward FET coupled between the secondary winding of the second transformer and the at least two electronic devices of the third set; and
the at least two electronic devices of the third set each comprise a flywheel field-effect transistor (FET) coupled to the output choke inductor.

16. A cooling assembly for electronic devices, the cooling assembly comprising:
a circuit board having a first surface and a second surface opposite the first surface;
a first set of electronic devices, a second set of electronic devices, and a third set of electronic devices, each set including at least two electronic devices electrically coupled in parallel and disposed on the first surface of the circuit board; and
a heat sink disposed on the second surface of the circuit board, the heat sink including a first heat sink portion including multiple board contact surfaces each in thermal contact with the second surface of the circuit board opposite a corresponding one of the first set of electronic devices, a second heat sink portion including multiple board contact surfaces each in thermal contact with the second surface of the circuit board opposite a corresponding one of the second set of electronic devices, a third heat sink portion including multiple board contact surfaces each in thermal contact with the second surface of the circuit board opposite a corresponding one of the third set of electronic devices, a fin structure in thermal contact with the three heat sink portions, and an electrical insulation layer disposed between the fin structure and the three heat sink portions to electrically isolate the three heat sink portions from one another, the first, second and third heat sink portions positioned in an interleaved arrangement to overlap one another while remaining electrically isolated from one another, and at least one of the multiple board contact surfaces of the first heat sink portion adjacent one of the multiple board contact surfaces of the second heat sink portion and one of the multiple board contact surfaces of the third heat sink portion.

17. The cooling assembly of claim 16, wherein each set of electronic devices includes a third electronic device.

18. The cooling assembly of claim 16, wherein at least one of the electronic devices includes a non-insulated electronic device.

19. The cooling assembly of claim 16, wherein the circuit board includes, for each of the electronic devices, one or more via holes between the first surface and the second surface to facilitate the thermal contact between said electronic device and the heat sink.

20. The cooling assembly of claim 16, wherein at least one electronic device includes a metal-oxide-semiconductor field-effect transistor (MOSFET), and a drain of the MOSFET is in thermal contact with the heat sink.

* * * * *